United States Patent [19]
Yang et al.

[11] Patent Number: 5,418,176
[45] Date of Patent: May 23, 1995

[54] PROCESS FOR PRODUCING MEMORY DEVICES HAVING NARROW BURIED N+ LINES

[75] Inventors: Ming-Tzong Yang; Cheng-Han Huang; Chen-Chiu Hsue, all of Hsin-chu, Taiwan, Prov. of China

[73] Assignee: United Microelectronics Corporation, Hsinchu, Taiwan, Prov. of China

[21] Appl. No.: 197,748

[22] Filed: Feb. 17, 1994

[51] Int. Cl.⁶ .......................................... H01L 21/8246
[52] U.S. Cl. ........................................ 437/52; 437/26; 437/48
[58] Field of Search ................. 437/26, 48, 52, 238; 257/390, 391

[56] References Cited

U.S. PATENT DOCUMENTS

| | | | |
|---|---|---|---|
| 3,970,486 | 7/1976 | Kooi | 148/187 |
| 4,101,344 | 7/1978 | Kool et al. | 437/70 |
| 4,385,432 | 5/1983 | Kuo et al. | 437/48 |
| 5,025,494 | 6/1991 | Gill et al. | 357/23.5 |
| 5,045,489 | 9/1991 | Gill et al. | 437/48 |
| 5,196,367 | 3/1993 | Lee et al. | 437/70 |

FOREIGN PATENT DOCUMENTS

| | | | |
|---|---|---|---|
| 0260841 | 10/1989 | Japan | 437/70 |
| 0101252 | 4/1991 | Japan | 437/26 |
| 0004137 | 1/1994 | Japan | 437/70 |

*Primary Examiner*—Tom Thomas
*Attorney, Agent, or Firm*—George O. Saile

[57] ABSTRACT

A process of fabricating a read only memory device (ROM) wherein the buried N+ lines have desirable well defined very narrow widths and are closely spaced. In the process, an insulating layer is deposited on the substrate. Openings for the buried N+ lines having vertical sidewalls are formed through the insulating layer. Spacer layers are formed on the vertical sidewalls of the openings. Impurities are implanted through the openings. The insulating layers is removed and the substrate is oxidized to form silicon oxide insulation strips over the buried N+ implanted regions. Next, the read only memory (ROM) device is completed by fabricating floating gates and overlying control gates between the buried N+ lines interconnected by a conductive lines that are orthogonal to the buried N+ buried lines.

17 Claims, 4 Drawing Sheets

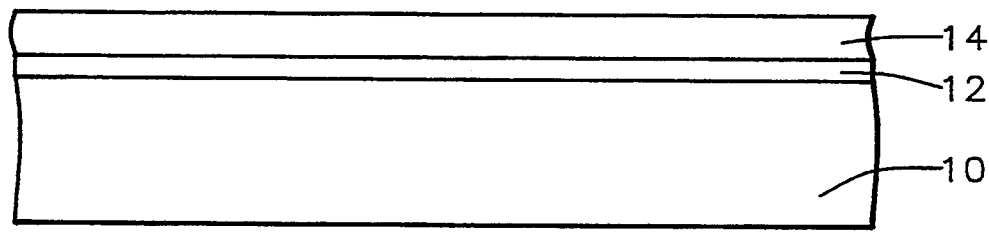
FIG. 1 - Prior Art
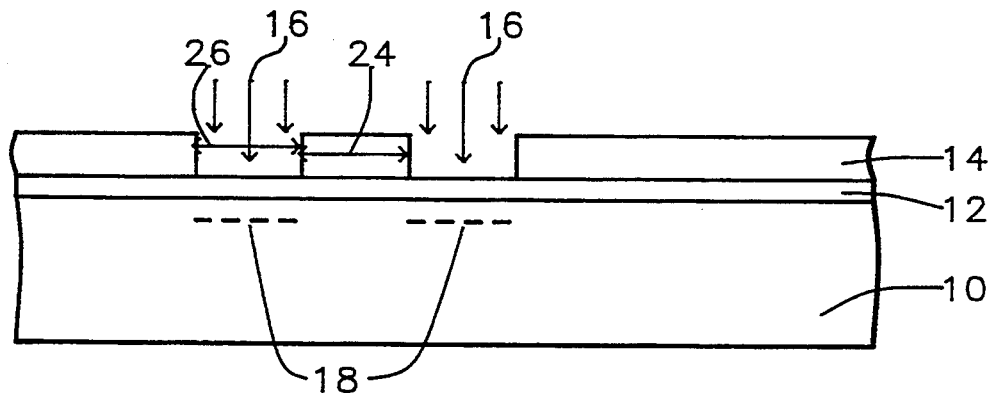
FIG. 2 - Prior Art
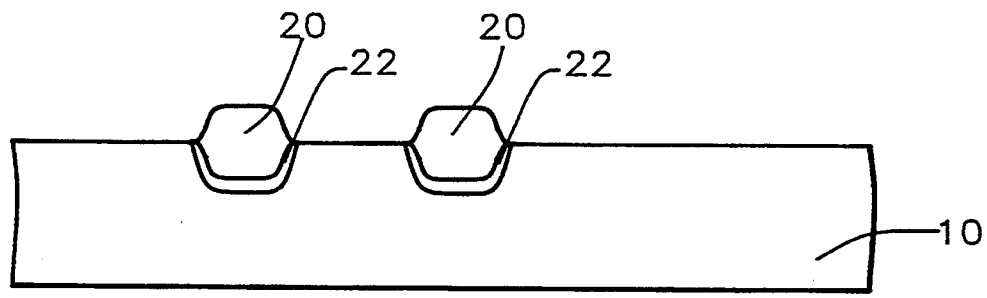
FIG. 3 - Prior Art

PROCESS FOR PRODUCING MEMORY DEVICES HAVING NARROW BURIED N+ LINES

BACKGROUND OF INVENTION (1) Field of the Invention

This invention relates to a memory type semiconductor device and in particular, to an improved process for forming very narrow, closely spaced, buried conductive lines for read only memory (ROM) devices.

(2) Description of the Prior Art

In the quest to achieve microminiaturization of integrated circuit devices, individual elements have been made very small and the elements have been closely packed. As ROM's are scaled down in dimensions, there is a continuous challenge to maintain a sufficiently high punch-through voltage between the buried bit lines. In conventional methods for fabricating buried bit lines (normally buried N+lines) for a ROM, the photolithography resolution capability limits the minimum buried bit line width and spacings.

In the conventional prior art process, an insulating layer 12 (typically oxide) is deposited on a monocrystalline silicon substrate 10 as shown in FIGS. 1 through 3. Subsequently, a photoresist layer 14 is deposited over layer 12. As shown FIG. 2, the photoresist is exposed and developed to form openings 16 that define the closely spaced, narrow bit lines. Using layer 14 as an implant mask, impurity ions are implanted into the substrate 10 through openings 16. The remainders of layers 12 and 14 are removed. The substrate is subjected to an oxidizing atmosphere to oxidize the implanted regions 18 of the silicon substrate 10. The resultant silicon oxide regions 20 cause the implanted ions to further penetrate the substrate forming bit lines 22 beneath the regions. In the prior art process, the photolithography resolution capability limits the minimum openings 26 and spacing widths 24 in the photoresist used to form the bit lines and spacings. The process steps to complete the ROM device that follow the bit line fabrication are well known.

U.S. Pat. No. 5,025,494 discloses a process for forming buried line conductors under a thick oxide region in a semiconductor substrate. The oxide and impurity regions are formed by initially depositing a silicon oxide layer and an overlaying layer of silicon nitride on the surface of the substrate. After openings have been made through the layer, using conventional photolithographic techniques, impurity ions are implanted through the openings. The exposed substrate regions are oxidized using the process described in U.S. Pat. No. 3,970,486 or a high pressure oxidation process for forming field oxide regions. The lightly doped source and drain regions are formed in the substrate by forming a floating gate and conductive gate over the channel regions. The spacer sidewall structure are formed on the sides of the gates and the ion implantations made through the openings. The minimum width of the oxide regions is limited by photolithography resolution capabilities.

U.S. Pat. No. 5,196,367 discloses a process for forming semiconductor devices having field oxide isolation with a channel stop. A multilayer oxidation masking structure of a silicon oxide layer, a polycrystalline silicon layer and a silicon nitride layer is formed. The multilayer oxidation mask is patterned by removing the silicon nitride layer and a portion of the polycrystalline silicon layer in the areas designated to have field oxide isolation grown therein. A sidewall insulator structure is formed on the exposed sidewalls of the patterned oxidation mask. Impurities are implanted into the area designated to have field oxide isolation to form the channel stops. The sidewall insulator structure is removed leaving the oxidation masking layer. The field oxide insulator structure is grown by subjecting the structure to oxidation whereby the channel stop is confined under the field oxide isolation and not encroaching the planned device regions.

SUMMARY OF INVENTION

An object of the present invention is to provide a process of forming a ROM of a smaller size that is beyond the resolution of photolithographic processes.

Another object of the present invention is to provide a process for fabricating a ROM semiconductor device having very narrow and closely spaced buried N+lines.

In accordance with the above objects, a process for fabricating a ROM on a monocrystalline substrate with narrow buried conductive lines is provided. A thick insulating layer is formed on the surface of a monocrystalline semiconductor substrate. Openings having substantially vertical sidewalls are etched through the thick insulating layer. A conformal layer is deposited over the oxide layer and substrate. The conformal layer is anisotropically etched to form spacers on the vertical oxide sidewalls. Impurity ions are implanted through openings formed by the spacers. Next, the remaining insulating layer and spacers are removed. The implanted substrate regions are selectively oxidized to form silicon oxide insulation strips over the buried conductive implanted regions. These implanted regions are selectively oxidized because the oxidation rate in highly doped regions is faster than in low doped regions. Floating gates and overlaying control gates are formed between the buried conductive lines. The floating gates and overlaying control gates are interconnected by conductive lines that are orthogonal to the buried conductive lines (i.e. bit lines) to complete the ROM device.

BRIEF DESCRIPTION OF THE DRAWINGS

The drawings show the following:

FIGS. 1 through 3 are a sequence of cross sectional views in broken section in greatly enlarged scale that illustrate a device structure in various stages of fabrication in accordance with the prior art processes

DETAILED DESCRIPTION OF THE PREFERRED EMBODIMENTS

Figure 4:
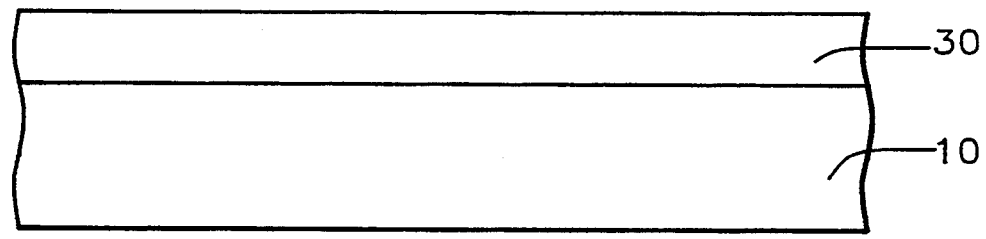
FIGS. 4 through 10 are a sequence of cross sectional views in broken section in greatly enlarged scale that illustrate a device structure in various stages of fabrication in accordance with the process of the invention.
Figure 5:
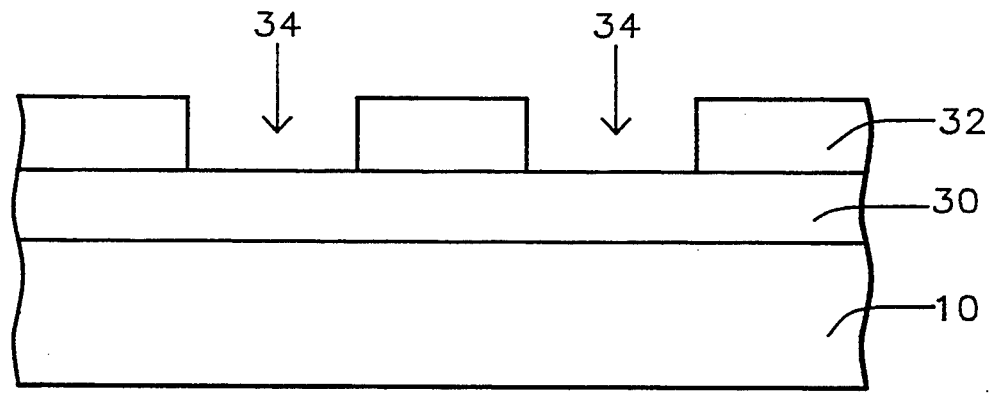
Figure 6:
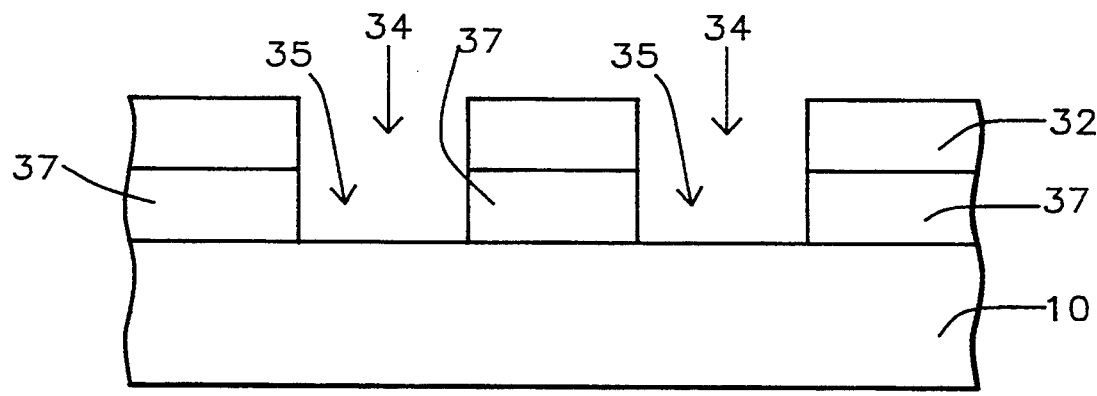

The present inventions will be described in detail with reference to the accompanying drawings. It should be noted that the drawings are in greatly simplified form. In practice the memory device structure will be one of many supported on a common substrate connected with suitable metallurgy in various electronic electric circuit configurations. The substrate shall be a monocrystalline silicon semiconductor body with many devices fabricated therein, as is well known in the art. The substrate 10 is preferable formed of monocrystalline silicon having a crystalline orientation of <100>. The background substrate dopant is preferably P-type, with a concentration in the range of 5E14 to 5E17 atoms/cm$^3$. Thick insulating layer 30, preferably oxide, is formed on substrate 10. The insulating layer 30 can be formed of any material which can function as an ion implantation mask. Suitable materials include silicon oxide and silicon nitride. Layer 30 typically has a thickness is in the range of 500 to 5000 Angstroms, more preferably a thickness of 1500 Angstroms. As shown in FIG. 5, the photoresist layer 32 is deposited over layer 30, exposed and developed to form openings 34. The openings 34 are elongated and define bit lines that will be subsequently formed in the substrate. In manufacturing semiconductor devices, an objective is to make all devices as small as possible. Photolithography normally is a limiting process for device miniaturization. Opening 34 represents the smallest possible opening achievable with the photolithography process. Likewise, the spacings between the openings 34, represent the smallest possible spacing achievable with the photolithography process. Openings 35 with substantial vertical sidewalls are anisotrophically etched through layer 30 using layer 32 as a mask thereby forming masking lines 37. The openings 35 have a width not greater than 2 microns. The remaining insulating layer 30 is a plurality of closely spaced parallel lines, each having a width not greater than 1.8 microns. Next, the remaining portions of the resist layer 32 are then removed.

Figure 7:
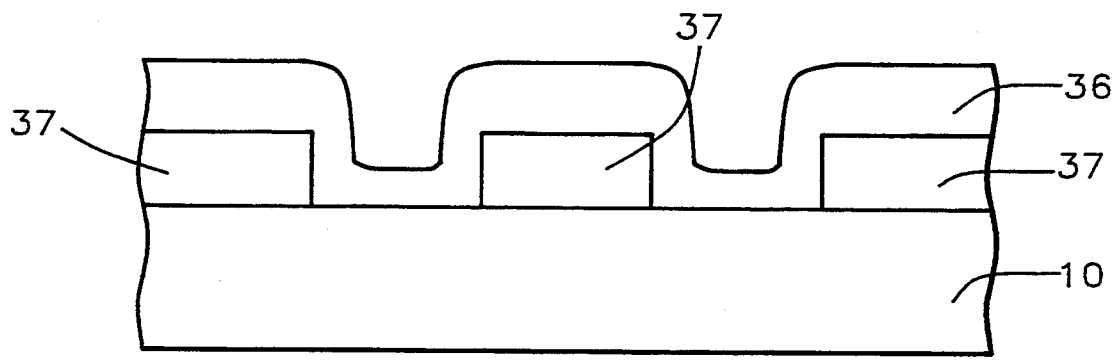
Figure 8:
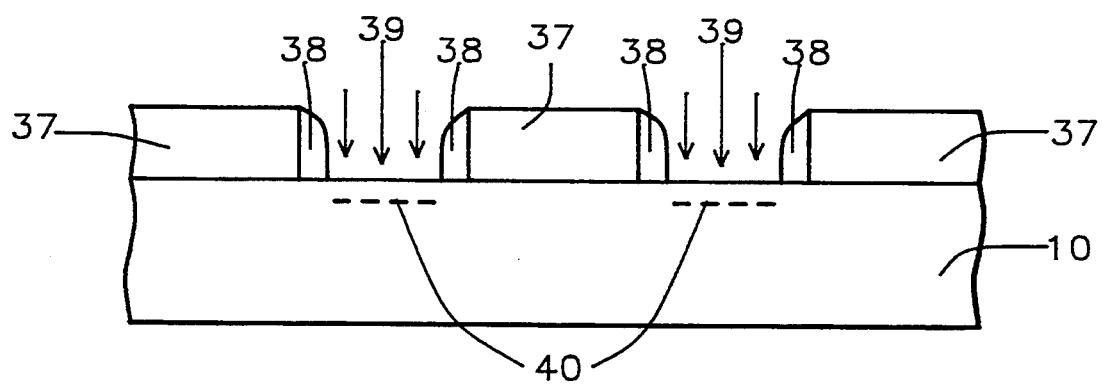
Figure 9:
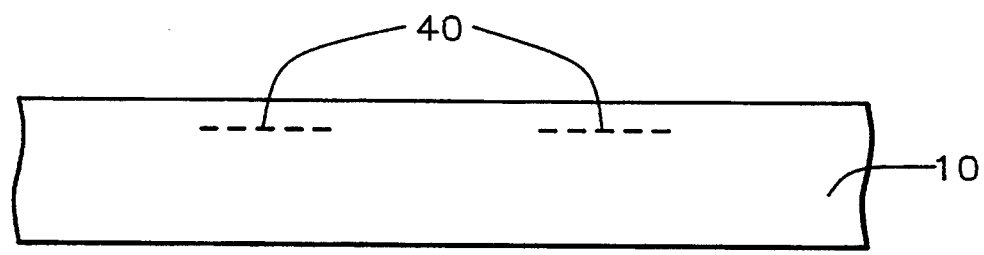
Figure 10:
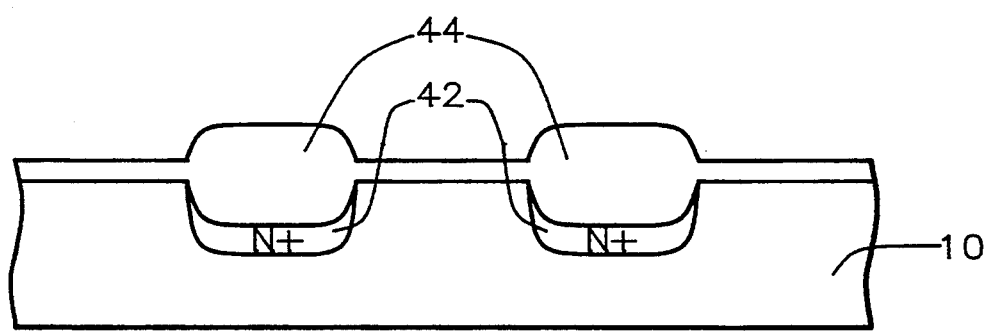

As shown in FIG. 7, a conformal insulating layer 36 is deposited over layer 30, the sidewalls of openings 35 and the substrate 10. Layer 36 is preferably silicon oxide or silicon nitride deposited by atmospheric pressure chemical deposition (APCVD), low pressure chemical vapor deposition (LPCVD) or plasma enhanced chemical vapor deposition (PECVD). Layer 36 has a thickness in the range of 500 to 5000 Angstroms, more preferably on the order of 1500 Angstroms. Next, as shown in FIG. 8, the conformal layer 36 is anisotrophically etched by a directional reactive ion etching (R.I.E.) to expose the substrate surface. Spacers 38 are formed on the vertical sidewalls of openings 35. Impurity ions of a type opposite the background substrate impurity 10 are implanted through the openings 39 defined by the spacers 38 to form the buried ion implanted regions 40. The openings 39 are narrower than the narrowest possible openings using the maximum resolution of the photolithographic process. The ion implantation is typically achieved by implanting n-type ions, preferably arsenic ions, at a voltage in the range of 20 to 150 keV and a dosage in the range of 5E13 to 5E16 atoms/cm$^2$. Next, the remaining thick insulating layer lines 37 and spacers 38 are removed using a conventional etching process. As shown in FIG. 10, the ion implant damaged silicon crystals above regions 40 are preferentially oxidized forming the thick silicon oxide isolation strips 44. The implanted regions 40 are selectively oxidized because the oxidation rate in highly doped regions is faster than in low doped non-implanted regions. This mechanism is called differential oxidation or selective oxidation. The resultant silicon oxide strips 44 cause the implanted ions to further penetrate the substrate forming conductive lines 42 (i.e. bit lines). The silicon oxide strips typically have a thickness in the range of 300 to 5000 Angstroms, preferably on the order of 1000 Angstroms. The oxidation is preferably performed by exposing the substrate 10 to an oxidizing environment of oxygen ($O_2$) or oxygen and hydrogen ($O_2+H_2$), at a pressure in the range of 1 milli-torr to 750 torr and a temperature in the range of 750 to 1100° C. for a time in a range of 5 minutes to 2 hours. The conductive buried N+layer 42 has a buried depth beneath the silicon oxide strips in the range of 0.05 to 0.5 microns. Gates are interconnected by conductive lines that are orthogonal to the buried conductive lines 42 to complete the memory device.

While the invention has been particularly shown and described with reference to the preferred embodiments thereof, it will be understood by those skilled in the art that various changes in form and details may be made without departing from the spirit and scope of the invention.

What is claimed is:

1. A method of forming a read only memory device with closely spaced parallel buried conductive lines in a semiconductor substrate, the closely spaced buried conducive lines having an opposite conductivity type from conductivity of the substrate, the method comprising the steps of:

forming an insulating layer on the surface of the semiconductor monocrystalline silicon substrate, depositing a masking layer over the insulating layer, exposing, developing and etching, the masking layer to form openings that define the buried conductive lines, said openings in said masking layer having a width not greater than 2microns, anisotropically etching the insulating layer through the masking layer openings forming first openings with vertical sidewalls in the insulating layer, removing the masking layer, forming a conformal layer over the insulating layer and substrate, anisotropically etching the conformal layer to form spacers on the vertical sidewalls of the insulating layer thus forming smaller second openings defined by the spacers, ion implanting an impurity through the smaller second openings defined by the spacers to form buried conductive lines in the substrate, removing the insulating layer and spacers, oxidizing the silicon substrate to form silicon oxide insulation strips over the buried conductive lines, and forming orthogonal word lines over the buried conductive lines to complete the read only memory device.

2. The method of claim 1 wherein said insulating layer is silicon oxide having a thickness not greater than 5000 Angstroms.

3. The method of claim 1 wherein the insulating layer, after the first openings are formed, is a plurality of closely spaced parallel lines, each line having a width not greater than 1.8 microns.

4. The method of claim 1 wherein said conformal layer is formed of silicon oxide deposited by atmospheric chemical vapor deposition.

5. The method of claim 1 wherein said conformal layer is formed of silicon oxide deposited by plasma enhanced chemical vapor deposition.

6. The method of claim 1 wherein said conformal layer is formed of silicon oxide deposited by low pressure chemical vapor deposition.

7. The method of claim 4 wherein said conformal layer has a thickness in the range of 500 to 5000 Angstroms.

8. The method of claim 1 wherein said anisotropic etching is achieved by reactive ion etching.

9. The method of claim 1 wherein said ion implanted impurity is arsenic.

10. The method of claim 9 wherein said ion implanted impurity is introduced with a voltage in the range of 20 to 150 keV and a dosage in the range of 5E13 to 5E16 atoms/cm$^2$.

11. The method of claim 1 wherein said oxidation of the silicon substrate is performed in dry oxygen environment at a pressure in the range of 1 milli-torr to 760 torr, temperature in the range of 750° to 1100° C. and a time in the range of 5 minutes to 2 hours.

12. The method of claim 1 wherein said oxidation of the silicon substrate is performed in oxygen and steam environment at a pressure in the range of 1 milli-torr to 760 torr, temperature in the range of 750° to 1100° C. and a time in the range of 5 minutes to 2 hours.

13. The method of claim 11 wherein said the width of the resulting silicon oxide insulation strips is not greater than 5000 Angstroms and the thickness is in the range of 500 to 5000 Angstroms.

14. The method of claim 1 wherein said the depth of said buried conductive layer beneath the silicon oxide strips is the range of 0.05 to 0.5 microns.

15. The method of claim 1 wherein said conductive lines are formed of N+type impurities.

16. The method of claim 15 wherein said N+type impurity is arsenic.

17. The method of claim 1 wherein memory device is an read only memory having gates which are interconnected by conductive lines that are orthogonal to the buried conductive lines.

* * * * *